(12) United States Patent
Shukh

(10) Patent No.: US 9,171,601 B2
(45) Date of Patent: *Oct. 27, 2015

(54) SCALABLE MAGNETIC MEMORY CELL WITH REDUCED WRITE CURRENT

(71) Applicant: Alexander Mikhailovich Shukh, Savage, MN (US)

(72) Inventor: Alexander Mikhailovich Shukh, Savage, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/762,799

(22) Filed: Feb. 8, 2013

(65) Prior Publication Data

US 2013/0250669 A1    Sep. 26, 2013

Related U.S. Application Data

(63) Continuation-in-part of application No. 12/830,580, filed on Jul. 6, 2010, now Pat. No. 8,406,041.

(51) Int. Cl.
    *G11C 11/15*    (2006.01)
    *G11C 11/16*    (2006.01)
    *H01L 43/02*    (2006.01)

(52) U.S. Cl.
    CPC ............ *G11C 11/1675* (2013.01); *G11C 11/16* (2013.01); *H01L 43/02* (2013.01)

(58) Field of Classification Search
    CPC ........................... G11C 11/1675; G11C 11/15
    USPC .......... 365/173, 171, 133, 158, 189.16, 225.5
    See application file for complete search history.

(56) References Cited

U.S. PATENT DOCUMENTS

| | | | |
|---|---|---|---|
| 5,695,864 A | 12/1997 | Slonczewski | |
| 5,734,605 A * | 3/1998 | Zhu et al. | 365/173 |
| 6,532,164 B2 | 3/2003 | Redon et al. | |
| 6,842,366 B2 * | 1/2005 | Tanizaki et al. | 365/171 |
| 6,844,605 B2 | 1/2005 | Nishimura | |
| 6,845,038 B1 | 1/2005 | Shukh | |
| 6,980,469 B2 | 12/2005 | Kent et al. | |
| 7,006,375 B2 | 2/2006 | Covington | |
| 7,224,601 B2 | 5/2007 | Panchula | |
| 7,239,541 B2 | 7/2007 | Saito et al. | |
| 7,307,876 B2 | 12/2007 | Kent et al. | |
| 7,313,013 B2 | 12/2007 | Sun et al. | |

(Continued)

OTHER PUBLICATIONS

M. Nakayama et al., Spin transfer switching in TbCoFe/CoFeB/MgO/CoFeB/TbCoFe magnetic tunnel junctions with perpendicular magnetic anisotropy, JAP 103, 07A710 (2008).

H. Ohmori et al., Perpendicular magnetic tunnel junction with tunneling magnetoresistance ratio of 64% using MgO . . . , JAP 103, 07A911 (2008).

Z. Li et al., Perpendicular spin torques in magnetic tunnel junctions, Physical Review Letters, vol. 100, 246602 (2008).

Z. Diao et al., Spin transfer switching and spin polarization in magnetic tunnel junctions with MgO and Al2O3 barriers, Appl.Phys. Letters 87, 232502 (2005).

(Continued)

*Primary Examiner* — Andrew Q Tran

(57) ABSTRACT

One embodiment of a magnetic random access memory includes a magnetic memory cell comprising a magnetoresistive element including a free ferromagnetic layer comprising a reversible magnetization direction directed substantially perpendicular to a film plane in its equilibrium state, a pinned ferromagnetic layer comprising a fixed magnetization direction directed substantially perpendicular to the film plane, a tunnel barrier layer disposed between the free and pinned layers, and an assist ferromagnetic layer disposed adjacent to the free layer; circuitry for providing a bias magnetic field pulse along a magnetic hard axis of the free layer, circuitry for providing a spin-polarized current pulse through the magnetoresistive element in a direction perpendicular to the film plane, wherein the magnetization direction in the free layer is reversed by a collective effect of the bias magnetic field pulse and the spin-polarizing current pulse.

15 Claims, 12 Drawing Sheets

(56) References Cited

U.S. PATENT DOCUMENTS

| | | |
|---|---|---|
| 7,313,015 B2 | 12/2007 | Bessho |
| 7,480,171 B2 | 1/2009 | Peng et al. |
| 7,508,042 B2 | 3/2009 | Guo |
| 7,511,991 B2 | 3/2009 | Saito et al. |
| 7,532,505 B1 | 5/2009 | Ding |
| 7,821,819 B2 * | 10/2010 | Hachino ................ 365/158 |
| 2007/0086121 A1 | 4/2007 | Nagase et al. |
| 2007/0215967 A1 | 9/2007 | Wu et al. |
| 2008/0037314 A1 | 2/2008 | Ueda |
| 2009/0027810 A1 | 1/2009 | Hong et al. |

OTHER PUBLICATIONS

X. Zhu, J.-G.Zhu, Bias-field-free microwave oscillator driven by perpendicular polarized spin current, IEEE Trans.Magnagnetics, v.42, p. 2670 (2006).

X.Zhu, J.-G.Zhu, Spin torque and field-driven perpendicular MRAM designs scalable to multi-Gb/chip capacity, IEEE Trans.Magnetics, v.42, p. 2739 (2006).

T.Hatori et al., MTJ elements with MgO barrier using RE-TM amorphous layers for perpendicular MRAM, IEEE Trans.Magnetics, v.43, p. 2331 (2007).

* cited by examiner

SCALABLE MAGNETIC MEMORY CELL WITH REDUCED WRITE CURRENT

CROSS-REFERENCE TO RELATED APPLICATION

This application is a continuation-in-part of U.S. patent application Ser. No. 12/830,580, filed on Jul. 6, 2010, which claims the benefit under 35 U.S.C. §119(e) of U.S. provisional patent application Ser. No. 61/223,921, filed on Jul. 8, 2009, which are hereby incorporated by reference in their entireties.

FEDERALLY SPONSORED RESEARCH

Not Applicable

SEQUENCE LISTING OR PROGRAM

Not Applicable

FIELD OF THE APPLICATION

The present application relates to a magnetic random access memory and, more specifically, to a memory cell utilizing magnetic tunnel junction with perpendicular magnetization direction.

BACKGROUND

Magnetic random access memory (MRAM) is a new technology that will likely provide superior performance over existing flash memory technology and may even replace hard disk drives in certain applications requiring a compact nonvolatile memory device. In MRAM bits of data are represented by a magnetic configuration of a small volume of ferromagnetic material and its magnetic state that can be measured by magnetoresistive (MR) effect during a readback operation. The MRAM typically includes an array of memory cells with each cell containing one magnetic tunnel junction (MTJ) element that can store at least one bit of data.

Conventional MRAM designs employ an array of MTJ elements that are based on a giant magnetoresistance (GMR) where the elements represent patterned thin film multilayers that include at least one pinned magnetic layer and one free magnetic layer separated from each other by a thin tunnel barrier layer. The free layer has two stable directions of magnetization that are parallel or anti-parallel to the fixed direction of magnetization in the pinned layer. Resistance of the MTJ depends on the mutual orientation of the magnetizations in the free and pinned layers and can be effectively measured. A resistance difference between the parallel and anti-parallel states of the MTJ can exceed 600% at room temperature.

The direction of the magnetization in the free layer can be changed from parallel to anti-parallel or vice-versa by applying an appropriate cross-point addressing magnetic fields to the selected MTJ, by passing a spin-polarized current through the selected junction, or by using a combination of the external magnetic field along with spin-polarized current simultaneously affecting the selected MTJ.

Majority of the current MRAM designs uses the free and pinned layers made of magnetic materials with in-plane direction of the magnetization (anisotropy) in the MTJ. The in-plane MRAM (i-MRAM) suffers from a large cell size, low thermal stability, poor scalability, necessity to use MTJ with a special elliptical shape, and from other issues, which substantially limit the i-MRAM capacity and its application at technology nodes below than 90 nm. MRAM with a perpendicular direction of magnetization (p-MRAM) in the free and pinned layers of MTJ can solve the above problems since the magnetic materials with the perpendicular magnetization have a high intrinsic crystalline anisotropy that provides MTJ with the high thermal stability, excellent scalability and a possibility using junctions having any shape. However, current designs of the p-MRAM suffer from high write current or from the necessity to use additional write conductors that limit MRAM density.

FIG. 1 shows a schematic view of a p-MRAM cell 10 according to the U.S. Pat. No. 6,845,038 (Shukh). The cell 10 employs a field induced switching mechanism of MTJ based on simultaneous effect of two intersecting magnetic fields. The MTJ comprises a pinned layer 14 and a free layer 18 both having their magnetizations directed substantially perpendicular to layers plane in their equilibrium states and separated from each other by a thin tunnel barrier layer 16. The p-MRAM cell 10 further comprises two intersecting write lines: a write word line WWL and a write bit line WBL; and two contact layers 12 and 22. Write currents $I_{W1}$ and $I_{W2}$ running through the lines WBL and WWL generate magnetic write fields $H_{W1}$ and $H_{W2}$, respectively. The orientation of magnetization $M_{18}$ in the free layer 18 can be reversed by a simultaneous effect of the orthogonal magnetic fields $H_{W1}$ and $H_{W2}$.

In a "read" operation a selection transistor TR is opened by a bias voltage applied to its gate through a word line WL. The sense current of a relatively small magnitude flows through a bit line (BL), MTJ and TR. The current enables the resistance of the MTJ to be measured. By its comparison with the resistance of a reference memory cell (not shown), a magnetic state of the selected memory cell 10 can be determined. The memory cell 10 has a high thermal stability, good scalability and does not require special shape of the MTJ. However, the p-MRAM according to the prior art has an increased cell size, requires relatively high write currents $I_{W1}$ and $I_{W2}$, and suffers from half-selected cell problem.

FIG. 2 shows a structure of magnetic memory element 20 according to a prior art disclosed in the U.S. Pat. No. 7,432,574 (Nakamura et al.). The MTJ includes a pinned layer 14 and a free layer 18 both having perpendicular direction of magnetizations $M_{14}$ and $M_{18}$, respectively, separated from each other by a thin tunnel barrier layer 16. An insertion layer 24 is arranged between the tunnel barrier layer 16 and the free layer 18. The insertion layer 24 is made of a magnetic material with a saturated magnetization $M_S \leq 600$ emu/cm$^3$ that is necessary to obtain a GMR ratio of 20% or higher. Switching of the magnetization direction $M_{18}$ in the free layer 18 is provided by a spin-polarized current $I_S$ running through the MTJ.

The spin-polarized current $I_S$ of a controlled polarity, magnitude, and pulse duration can reverse the direction of magnetization $M_{18}$ in the free layer 18 by a spin momentum transfer. The spin momentum transfer is a phenomenon that occurs in current perpendicular to the plane (CPP) GMR devices that have cross-sectional areas of the order $10^4$ nm$^2$ or less. Strength of a spin torque is directly proportional to the $I_S$ current density running through the MTJ. The spin induced switching mechanism provides excellent cell selectivity in MRAM array; substantially lower switching spin-polarized current than that of the field induced switching MRAM and a possibility of substantial reduction of cell size.

However, maintaining a high precision of the current $I_S$ magnitude and pulse duration is extremely difficult. Moreover the spin-polarized current density required for switching is too high for integration with current CMOS technology. In addition, the high switching current running across the tunneling barrier layer 16 can create long-term reliability problems, for instance, its break down.

FIG. 3 shows a schematic cross-sectional view of MTJ element 30 with in-plane magnetizations $M_{14}$ and $M_{18}$ in the pinned 14 and free 18 layers, respectively, separated by a tunnel barrier layer 16. The MTJ element 30 employs a hybrid write mechanism according to a prior art disclosed in the U.S. Pat. No. 7,006,375 (Covington). An antiferromagnetic layer 32 controls a magnetization direction in the pinned layer 14 by exchange coupling between the layers. The hybrid write mechanism comprises producing a bias magnetic field $H_B$ along a magnetic hard axis of a free layer 18, and passing a spin-polarized current $I_S$ through the MTJ element 30 to reverse the magnetization direction $M_{18}$ in the free layer 18 by spin-induced switching. The bias magnetic field $H_B$ induced by a bias current $I_B$ of a relatively small magnitude facilitates and accelerates the magnetization direction $M_{18}$ reversal by the spin-polarized current $I_S$. However the MTJ element 30 suffers from the same problems as other MRAM using in-plane magnetization direction in the free layer 18, such as poor thermal stability and scalability, relatively high switching current $I_S$, necessity to use MTJ element of a special shape, and others.

What is needed is a simple design of MRAM having high thermal stability, excellent scalability, and low switching current that does not require a special shape of the MTJ element.

SUMMARY

The present application provides a magnetic memory cell with a perpendicular magnetization direction and a method of writing to the memory cell.

According to one aspect of the present application a magnetic memory cell comprises: a magnetoresistive element comprising a free ferromagnetic layer having a reversible magnetization direction directed substantially perpendicular to a film plane, a pinned ferromagnetic layer comprising a fixed magnetization direction directed substantially perpendicular to the film plane, a tunnel barrier layer disposed between the free and pinned layers, and an assist ferromagnetic layer disposed adjacent to the free layer; a means for providing a bias magnetic field along a magnetic hard axis of the free layer, and a means for providing a spin-polarized current through the magnetoresistive element in a direction perpendicular to the film plane, wherein the direction of magnetization in the free layer is reversed by a collective effect of a bias magnetic field pulse and a spin-polarizing current pulse.

According to another aspect of the present application a method of writing to a magnetic memory cell comprises: providing a magnetoresistive element comprising a free ferromagnetic layer having a reversible magnetization direction directed substantially perpendicular to a film plane, a pinned ferromagnetic layer having a fixed magnetization direction directed substantially perpendicular to the film plane, a tunnel barrier layer disposed between the free and pinned ferromagnetic layers, and an assist ferromagnetic layer disposed adjacent to the free layer; driving a bias current pulse through a first conductor line in a proximity to but not through the magnetoresistive element and producing a bias magnetic field along a magnetic hard axis of the free layer, and driving a spin-polarized current pulse through the magnetoresistive element in a direction perpendicular to the film plane and producing a spin momentum transfer; whereby the magnetization direction in the free layer is reversed by a collective effect of the substantially superimposed pulses of the bias and spin-polarized currents.

DETAILED DESCRIPTION

In the following detailed description of the embodiments, reference is made to the accompanying drawings that form a part hereof, and in which are shown by way of illustration specific embodiments in which the application can be practiced. It is understood that other embodiments may be utilized and structural changes may be made without departing from the scope of the present application.

The leading digits of reference numbers appearing in the Figures generally corresponds to the Figure number in which that component is first introduced, such that the same reference number is used throughout to refer to an identical component which appears in multiple Figures.

Figure 1:
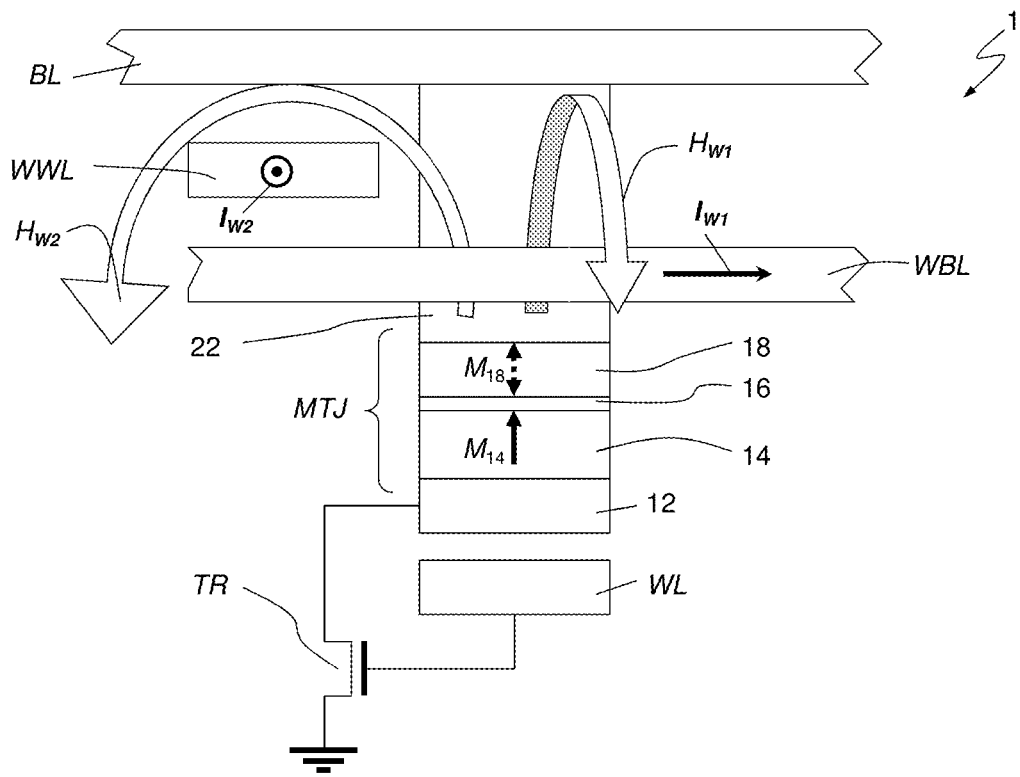
FIG. 1 illustrates a schematic view of a prior art MRAM cell with a perpendicular magnetization direction in free and pinned layers of MTJ using magnetic field induced switching.
Figure 2:
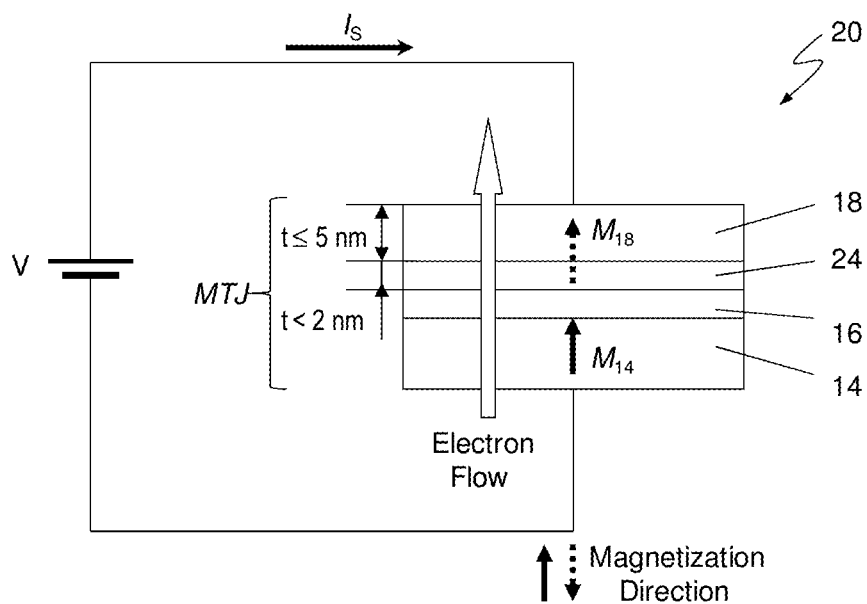
FIG. 2 is a schematic side view of a magnetic memory element according to a prior art with a perpendicular magnetization direction in free and pinned layers using spin-induced switching.
Figure 3:
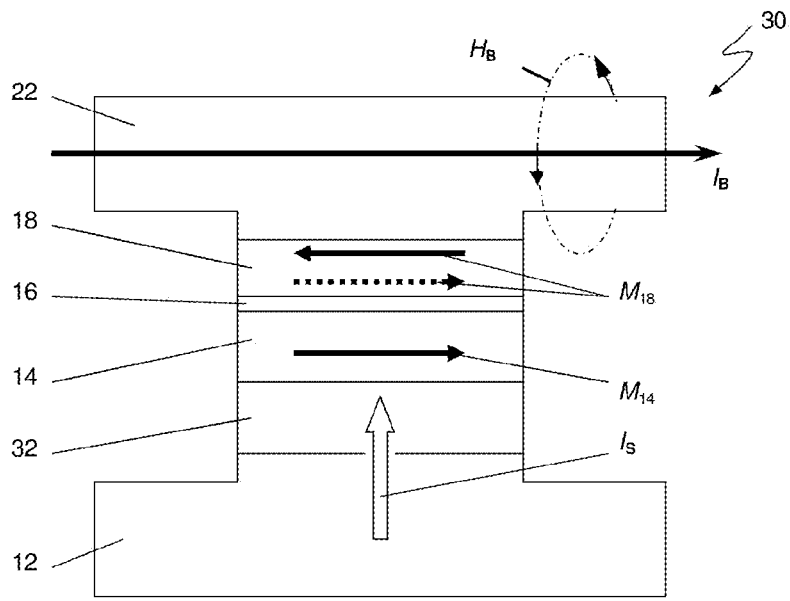
FIG. 3 is a schematic sectional view of a prior art MTJ element with in-plane magnetization direction in free and pinned layers using a hybrid switching mechanism.
Figure 4:
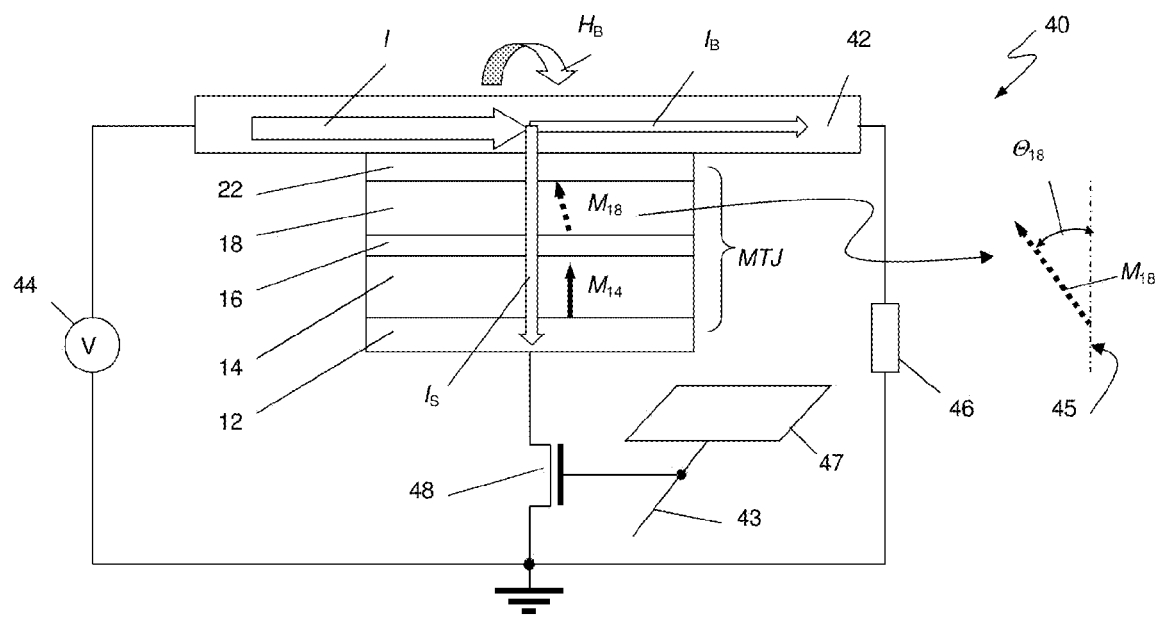
FIG. 4 is a schematic view of MRAM cell with perpendicular magnetization direction in free and pinned layers employing a hybrid switching mechanism according to one embodiment of the present application.

FIG. 4 shows a schematic view of MRAM cell 40 comprising a MTJ element, a first conductor line 42, a second conductor line 43, a voltage source 44, a bias current circuitry 46, a spin-polarized current circuitry 47, and a selection device 48. The voltage source 44 is connected in series with the first conductor line 42 and the bias current circuitry 46. The MTJ element is connected in series with the voltage source 44 and the selection device 48 that is connected to the spin-polarized current circuitry 47 through the second conductor line 43. The MTJ element is disposed at an intersection of the conductor lines 42 and 43 in vertical space between them.

In some embodiments the MTJ element of the memory cell 40 includes a pinned layer 14, a free layer 18 with a tunnel barrier layer 16 disposed between the layers. The pinned layer 14 has a fixed magnetization direction $M_{14}$ directed substantially perpendicular to a layer plane. The free layer 18 has a changeable direction of magnetization $M_{18}$ that is directed substantially perpendicular to a layer plane in its equilibrium state. The magnetization direction $M_{18}$ of the free layer 18 can be reversed by a spin-polarized current $I_S$ only running through the MTJ in a direction perpendicular to a MTJ plane or by a collective effect of the spin-polarized current $I_S$ along with a bias magnetic field $H_B$. The magnetization direction $M_{18}$ in the free layer 18 can be set into parallel or anti-parallel configuration with respect to the pinned layer 14 by simply changing the direction of the spin-polarized current $I_S$ in the MTJ element. The MTJ element further includes two contact layers 12 and 22. The first contact layer 22 is placed between the first conductor line 42 and the free layer 18 of the MTJ. The second contact layer 12 is positioned between the pinned layer 14 and the selection device 48.

Spin-induced switching mechanism provides a good cell selectivity in the MRAM array but it is sensitive to a magnitude and duration of the spin-polarized current pulse. Besides, the spin-polarized current required to reverse the magnetization direction in the free layer 18 is substantially high and can cause degradation or even break down of the tunnel barrier layer 16. To reduce the spin-polarized switching current $I_S$ and to improve control of the magnetization direction reversal in the free layer 18 a bias magnetic field $H_B$ is applied along hard magnetic axis of both the pinned 14 and free 18 layers.

The bias magnetic field $H_B$ induced by a pulse of the bias current $I_B$ running through the first conductor line 42 is applied to the free layer 18 along its hard axis. The field $H_B$ is strong enough to tilt the magnetization $M_{18}$ on an angle $\Theta_{18}$ relatively to an axis 45 that is perpendicular to a layer plane. A reversal of the magnetization direction $M_{18}$ in the free layer 18 can occur when a pulse of the spin-polarized current $I_S$ running through the MTJ overlays in time the pulse of the bias magnetic field $H_B$. To reduce a total switching energy it is desirable that the pulses of the currents $I_B$ and $I_S$ substantially superimpose each other. Order of the pulses can be any.

Figure 5:
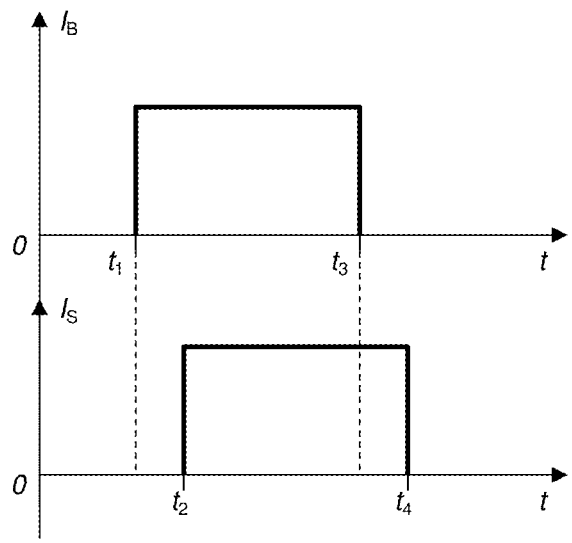
FIG. 5 is a graph illustrating a timing diagram of a bias current pulse and a spin-polarized current pulse during MTJ switching.

FIG. 5 illustrates a timing diagram of the bias $I_B$ and the spin-polarized $I_S$ current pulses during writing to the memory cell 40. At a time $t_1$, the bias current $I_B$ in the first line 42 is turned on. The current $I_B$ induces a magnetic field $H_B$ in the vicinity of the line 42 that is proportional to the current magnitude and is inverse proportional to a distance from the line 42. The bias magnetic field $H_B$ can tilt the magnetization $M_{18}$ in the free layer 18 on the angle $\Theta_{18}$ relatively to the perpendicular axis 45. The direction of the magnetization $M_{14}$ in the pinned layer 14 does not change due to a substantially higher coercivity (anisotropy) of the pinned layer relatively to the coercivity (anisotropy) of the free layer 18. At a time $t_2$, a spin-polarized current $I_S$ is turned on by applying a positive bias voltage to a gate of selection transistor 48 through a second conductor line 43. Magnitude, duration and timing of the current $I_S$ pulse are controlled by the spin-polarized current circuitry 47. The magnitude of the bias current $I_B$ may remain constant when the spin-polarized current $I_S$ is turned on or off to offer the controllable tilting angle $\Theta_{18}$. This condition is provided by the bias current circuitry 46 connected in series with the voltage source 44. The spin-polarized current $I_S$ running through the MTJ element should be high enough to cause the magnetization direction $M_{18}$ reversal in the free layer 18 by a spin momentum transfer when $I_B$ and $I_S$ are both on, but be insufficient to reverse the magnetization direction $M_{18}$ alone when the bias current $I_B$ is off. Order of the current pulses can be any. An inability of the spin-polarized current IS alone to reverse the magnetization direction in the free layer can prevent the MTJ from unwanted magnetization direction reversal during a read operation.

At a time $t_3$, the bias current $I_B$ in the first conductor line 42 and the related bias magnetic field $H_B$ are turned off. The tilting angle $\Theta_{18}$ vanishes and the magnetization direction $M_{18}$ in the free layer 18 returns to one of its equilibrium positions along the axis 45: up or down depending on the polarity of the spin-polarized current $I_S$. In the given configuration of the current pulses the time $t_3$ can determine the end of the magnetization $M_{18}$ reversal in the free layer 18. Time $t_4$ defines the duration of the spin-polarized current $I_S$ pulse in the MTJ. Order of the bias current and spin-polarized current pulses can be any. Duration and magnitude of the current pulses depend on MTJ size and structure, on material properties, and other parameters. Hybrid switching mechanism provides an efficient method of a spin-polarized current reduction in the perpendicular MRAM along with a write speed increase.

Figure 6:
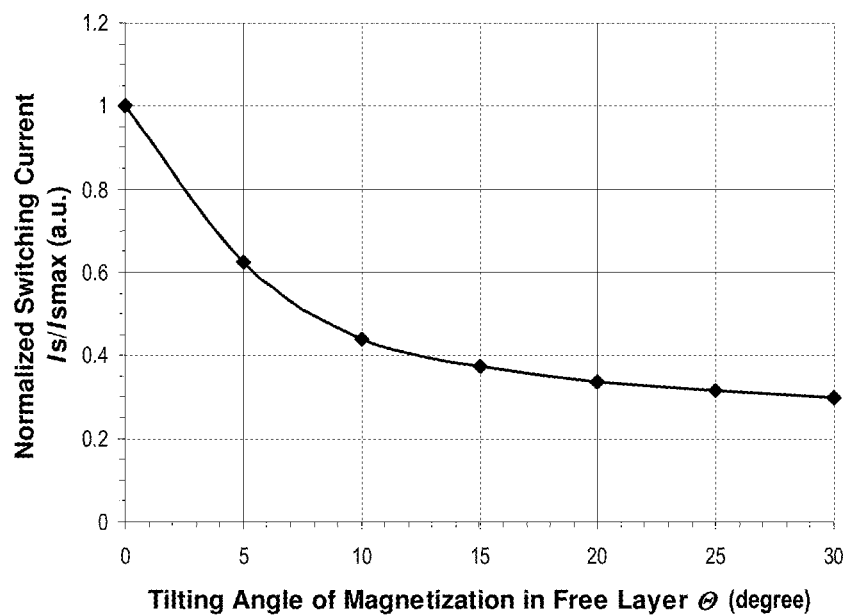
FIG. 6 is a graph illustrating a simulated dependence of normalized magnitude of a spin-polarized switching current on tilting angle of magnetization direction in the free layer relatively to an axis perpendicular to a layer plane.

FIG. 6 shows a calculated dependence of a normalized magnitude of the spin-polarized switching current $I_S$ that is required to reverse the magnetization direction $M_{18}$ on the tilting angle $\Theta_{18}$ of the magnetization direction in free layer 18 relatively to the axis 45. Calculations were done at the fixed duration of the $I_S$ pulse. The switching current $I_S$ decreases rapidly with the angle $\Theta_{18}$. For instance, the magnitude of the spin-polarized current can be reduced almost twice at the tilting angle $\Theta_{18}$ of about 8 degrees. On the other hand, the MTJ exhibits its maximum GMR value when the magnetizations in the pinned and free layers are parallel or anti-parallel to each other during read back operation. Hence the optimal combination of writing and reading parameters of the perpendicular MRAM can be achieved when the direction of the magnetizations in the pinned layers are parallel or anti-parallel to each other during reading and are misaligned (the magnetization direction in one of the layers is tilted) during writing.

Figure 7:
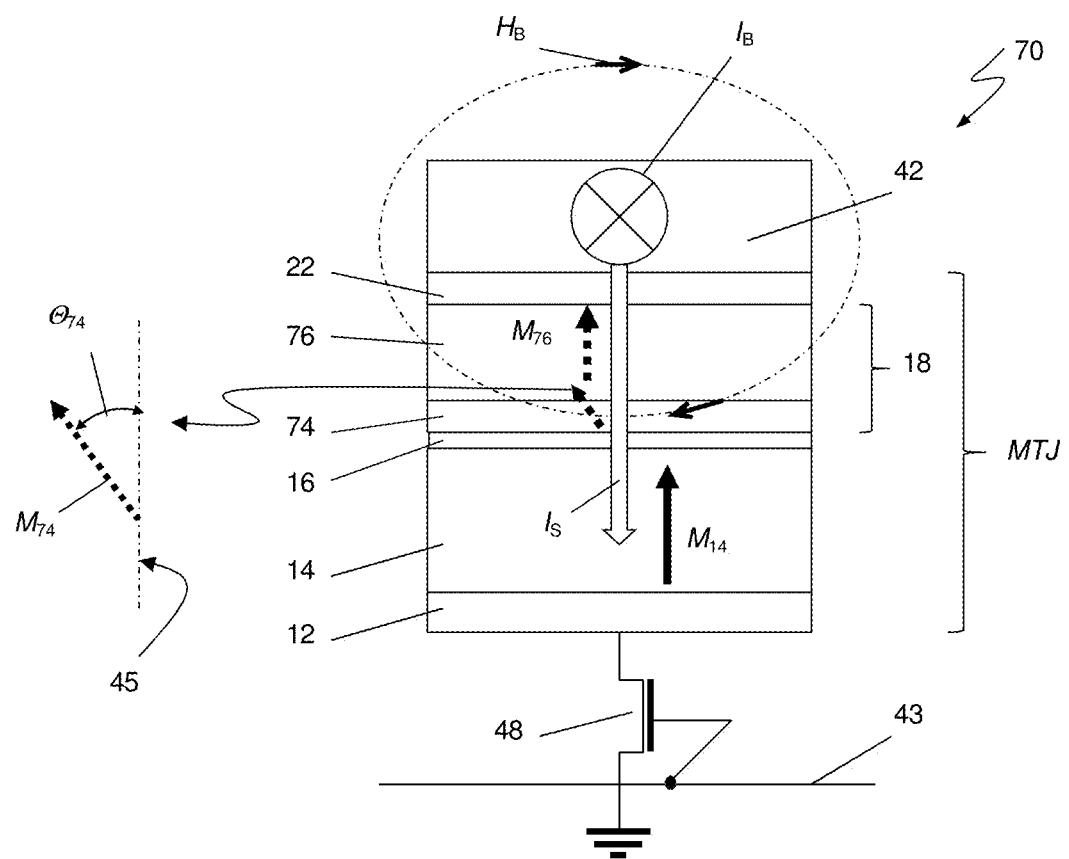
FIG. 7 is schematic sectional view of a perpendicular MRAM cell with bi-layer structure of the free layer according to another embodiment of the present application.

FIG. 7 shows a schematic sectional view of a perpendicular MRAM cell 70 according to another embodiment of the present application. The memory cell 70 employs a hybrid switching mechanism. To reduce the bias current $I_B$ the free layer 18 of the MTJ may have a bi-layer structure comprising a soft magnetic underlayer 74 and a storage layer 76 wherein the underlayer 74 is disposed adjacent the tunnel barrier layer 16. The layers 74 and 76 are substantially magnetically coupled to each other. The storage layer 76 is made of magnetic material having a first coercivity and a perpendicular anisotropy. The direction of magnetization $M_{76}$ in the storage layer 76 is substantially perpendicular to a layer plane in its equilibrium state. The underlayer 74 can be made of a soft magnetic material with a high spin polarization that is desirable for reduction of the switching current and for GMR increase. Coercivity of the underlayer 74 is substantially lower than that of the layer 76. The material of the underlayer 74 can have either in-plane or perpendicular anisotropy. Due to a substantial magnetic coupling with the storage layer 76 the direction of the magnetization $M_{74}$ in the underlayer 74 can be substantially perpendicular to an underlayer plane in its equilibrium state. Bias magnetic field $H_B$ applied along its hard magnetic axis can tilt the magnetization direction $M_{74}$ in the underlayer 74 on the angle $\Theta_{74}$. As a result, the spin-polarized current $I_S$ of a relatively small magnitude and duration can reverse the magnetization direction in the underlayer 74 and in the storage layer 76 as well since the layers are substantially magnetically coupled to each other. The tilting angle $\Theta_{74}$ depends on bias field strength, thickness and magnetic properties of the underlayer 74 and on strength of magnetic coupling between the layers 74 and 76.

At some conditions, when the soft underlayer 74 is made of magnetic material with in-plane anisotropy the required tilting angle $\Theta_{74}$ can be achieved without use of the magnetic bias field $H_B$. The tilting angle can be provided by a strong demagnetizing field in the underlayer 74 that could not be surmounted by the exchange magnetic coupling between the layers 74 and 76. However, it might result in the reduction of the read-back signal and might require a precise control of the spin-polarized current pulse parameters during writing, such as the magnitude and the duration.

Figure 8:
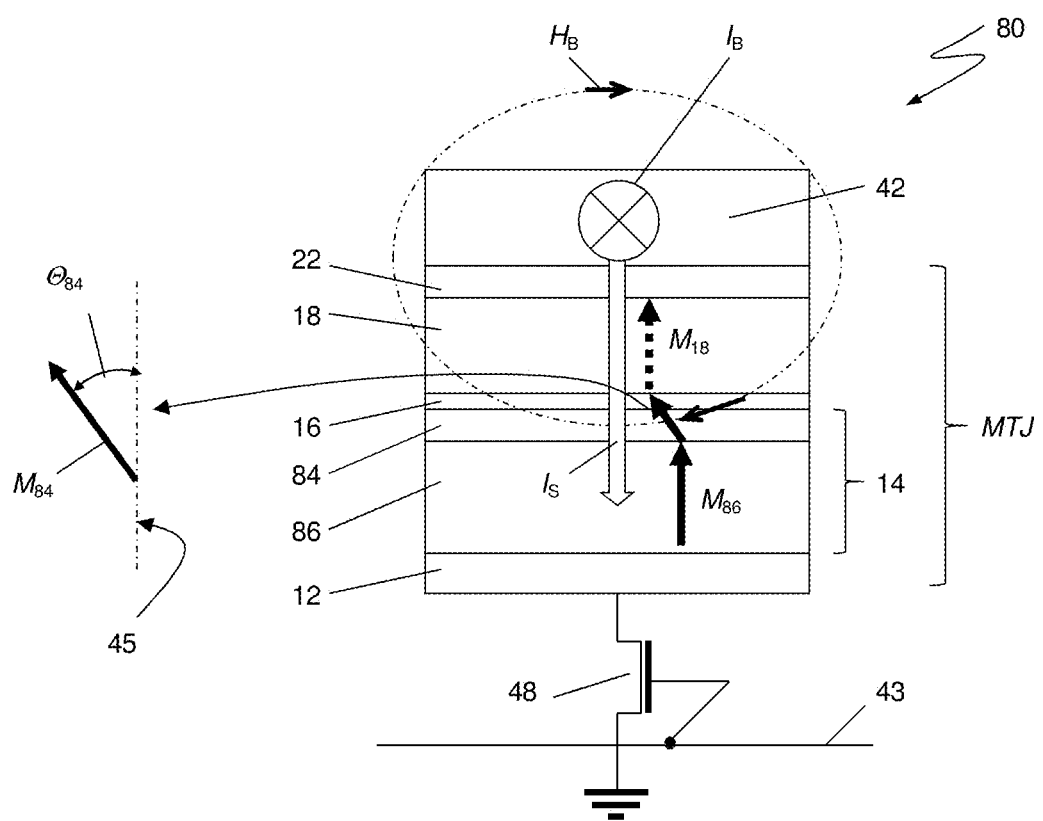
FIG. 8 is a schematic sectional view of a perpendicular MRAM cell with bi-layer structure of the pinned layer according to a yet another embodiment of the present application.

Yet another embodiment of the present application is shown in FIG. 8. Perpendicular MRAM cell 80 employs a bi-layer structure of the pinned layer 14 comprising a spin-polarizing layer 84 and a reference layer 86. The reference layer 86 can be made of a hard magnetic material with a perpendicular anisotropy. The magnetization direction $M_{86}$ in the reference layer 86 is directed substantially perpendicular to the layer plane. The spin-polarizing layer 84 can be made a soft magnetic material with a high spin polarization. A coercivity of the layer 84 can be substantially lower than that of the reference layer 86. The layer 84 can be made of magnetic material with either in-plane or perpendicular anisotropy. The magnetic layers 84 and 86 can be substantially magnetically coupled to each other. The reference layer 86 can force the direction of the magnetization $M_{84}$ in the spin-polarizing layer 84 to be substantially perpendicular to the layer plane in its equilibrium state. The magnetization direction $M_{84}$ can be tilted on the angle $\Theta_{84}$ by the bias magnetic field $H_B$. The bias field $H_B$ can be insufficient to tilt the magnetization direction $M_{18}$ in the free layer 18. To reverse the magnetization direction $M_{18}$ in the free layer 18 an additional the spin-polarized current $I_S$ can be applied to the MTJ.

Figure 9:
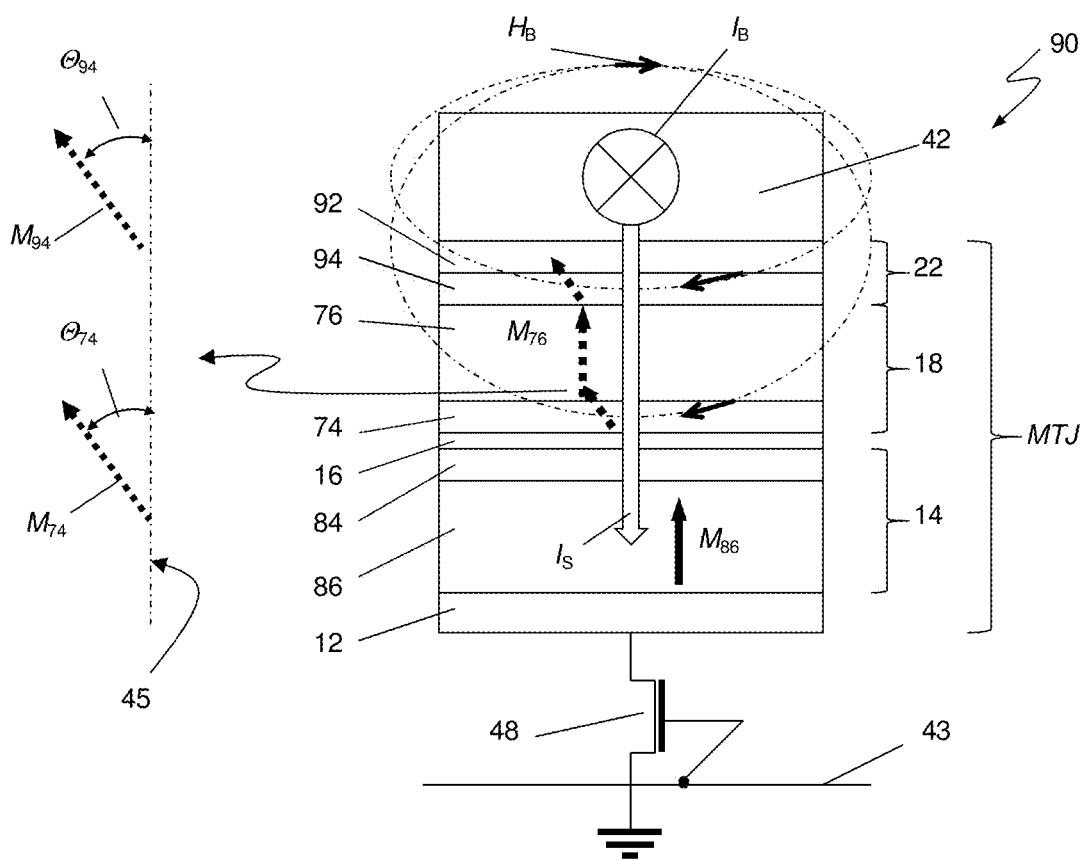
FIG. 9 is a schematic sectional view of a perpendicular MRAM cell with a bi-layer structure of pinned, free and contact layers according to a still another embodiment of the present application.

The MRAM cell 90 shown in FIG. 9 represents yet another embodiment of the present application. MTJ of the cell 90 includes a pinned layer 14, a free layer 18, a tunnel barrier layer 16 and two contact layers 12 and 22 disposed adjacent the free layer 18 and the pinned layer 14, respectively. The layers 14 and 16 have a bi-layer structure, wherein the pinned layer 14 comprises the spin-polarizing layer 84 and the reference layer 86, and the free layer 14 includes the soft-magnetic underlayer 74 and the storage layer 76. The tunnel barrier layer 16 is disposed between the spin-polarizing layer 84 and the soft magnetic underlayer 74. The first contact layer 22 can have a bi-layer structure comprising a non-magnetic sublayer 92 and magnetic sublayer 94 (assist ferromagnetic layer 94), wherein the magnetic sublayer 94 is disposed adjacent the free layer 18. The magnetic sublayer 94 can be made of soft magnetic material having a coercively substantially lower than that of the storage layer 76 with either in-plane or perpendicular anisotropy. The sublayer 94 has a substantial magnetic coupling with the free layer 18 that forces the magnetization $M_{94}$ to be oriented substantially perpendicular to the layer plane in its equilibrium state. The bias magnetic field $H_B$ applied to the MTJ along its hard axis can tilt the magnetization directions both in the soft magnetic underlayer 74 and in the magnetic sublayer 94 on angles $\Theta_{74}$ and $\Theta_{94}$, respectively. The above conditions can provide a reduction of the spin-polarized current $I_S$ and facilitate the magnetization direction reversal in the free layer 18. The second contact layer 12 can also have a multilayer structure, for instance comprising a non-magnetic sublayer and antiferromagnetic sublayer, wherein the antiferromagnetic sublayer being in direct contact with the pinned layer 14 to increase coercivity of the pinned layer 14.

Figure 10:
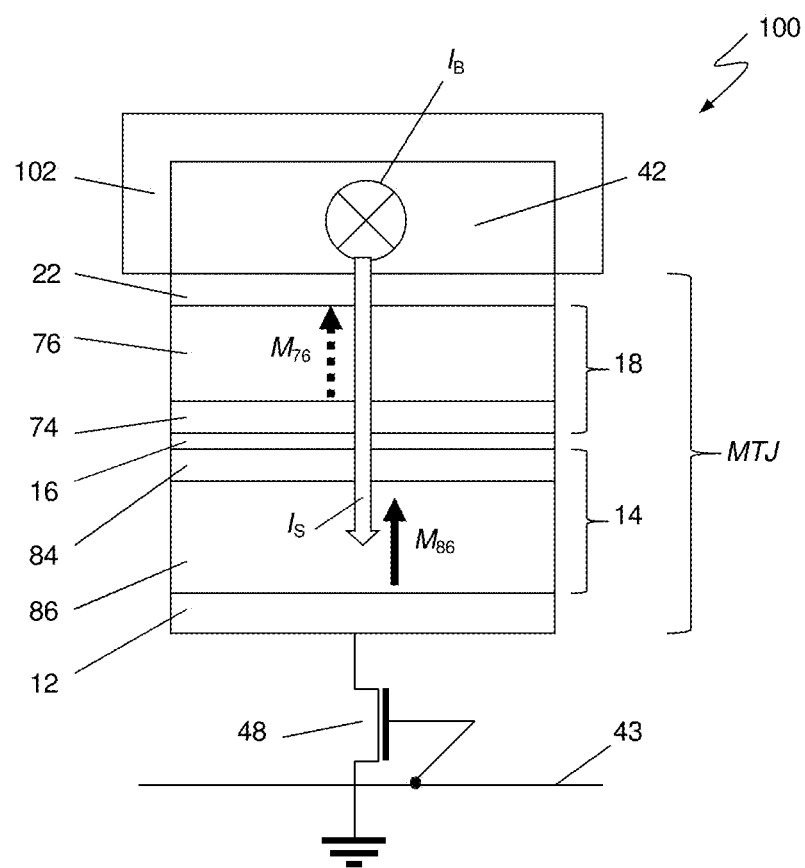
FIG. 10 is a schematic sectional view of a perpendicular MRAM cell with a cladded first conductor line according to a still another embodiment of the present application.

FIG. 10 shows a schematic view of a perpendicular MRAM cell 100 with a cladded first conductor line 42 according to a still another embodiment of the present application. Cladding layer 102 can be made of a soft magnetic material having a substantial permeability. The cladding layer 102 can magnify the bias magnetic field $H_B$ in vicinity of the free layer 18 that can allow a substantial reduction of the bias current $I_B$ to achieve a desirable tilt angle $\Theta$.

Figure 11:
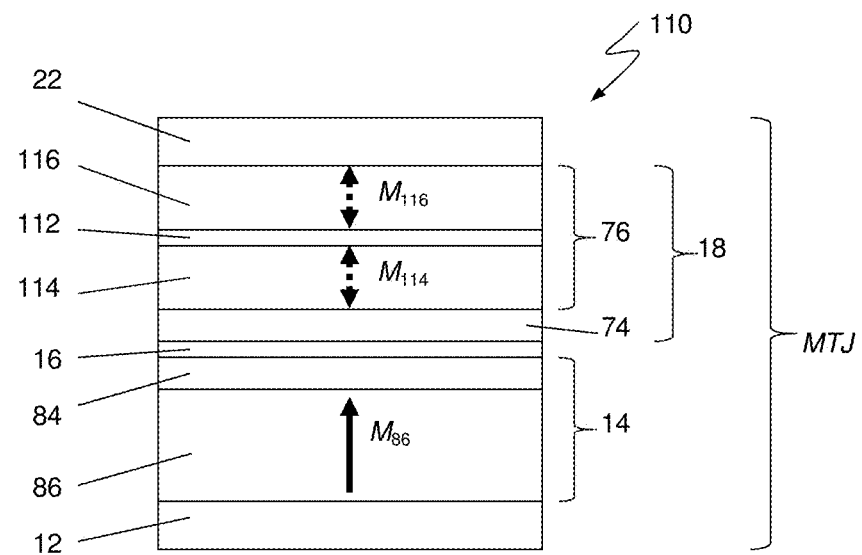
FIG. 11 is a section view of a perpendicular MTJ element with a laminated storage layer of the free layer according to a still another embodiment of the present application.

FIG. 11 shows a schematic sectional view of perpendicular MTJ 110 that comprises a storage layer 76 made of a multilayer structure. The multilayer structure can include at least two magnetic storage sublayers 114 and 116 separated from each other by a non-magnetic spacer layer 112. The spacer layer 112 can provide a substantial magnetic coupling between the sublayers 114 and 116. Type of magnetic coupling between the sublayers 114 and 116 can be ferromagnetic or antiferromagnetic and its strength depends on thickness and on material properties of the spacer layer 112. The storage sublayers 114 and 116 can be made of magnetic materials with a perpendicular anisotropy and have their magnetizations $M_{114}$ and $M_{116}$ oriented substantially perpendicular to layer plane. The sublayers 114 and 116 can have substantially different coercivities. Position of the sublayers with high and low coercivity relatively the tunnel barrier layer 16 depends on MRAM cell design. For instance, the sublayer 114 of the MTJ 110 can have lower coercivity than that of the sublayer 116. The storage sublayer 114 can have a substantial magnetic coupling with the soft magnetic underlayer 74. The multilayer structure of the storage layer 76 with the above properties can provide the free layer 18 with a high thermal stability along with a reduced spin-polarized current $I_S$. Numbers of magnetic sublayers and non-magnetic spacers, respectively, in the storage layer 76 can be any.

Figure 12:
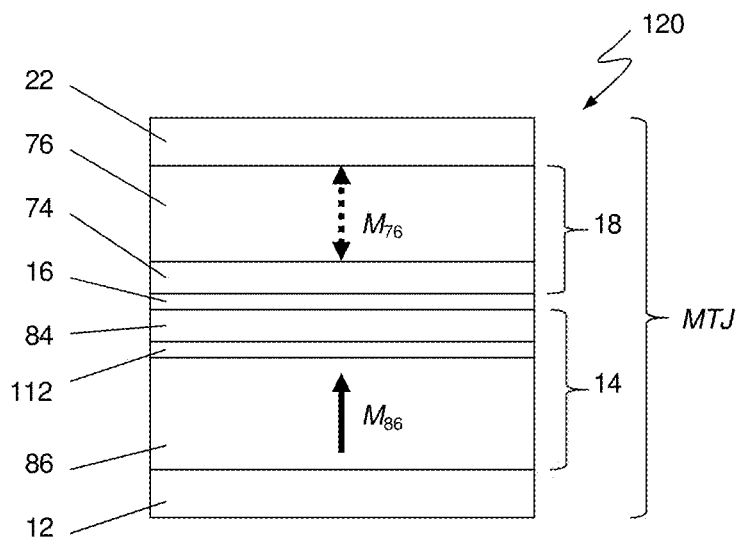
FIG. 12 is a sectional view of a perpendicular MTJ element with tri-layer structure of the pinned layer according to a still another embodiment of the present application.

In a still another embodiment as shown in FIG. 12 MTJ 120 comprises a laminated structure of the pinned layer 14. The layer 14 can include the spin-polarizing layer 84 and the reference layer 86 separated from each other by a non-magnetic spacer layer 112. The spacer layer 112 can provide a possibility of exchange coupling control between the spin-polarizing layer 84 and the reference layer 86 that results in a possibility to reduce the spin-polarized current $I_S$ and to increase a switching speed of the MTJ 120.

Figure 13:
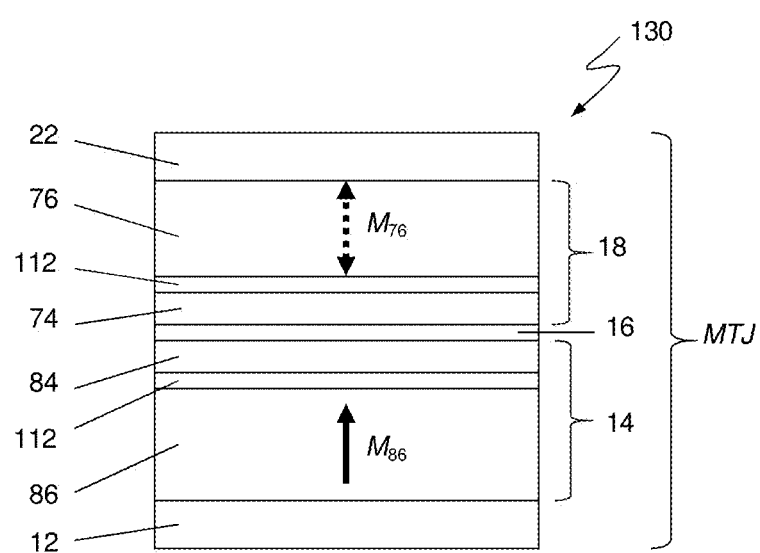
FIG. 13 is a sectional view of a perpendicular MTJ element with tri-layer structures of the free and the pinned layers according to a still another embodiment of the present application.

MTJ 130 shown in the FIG. 13 represents a still another embodiment of the present application. The pinned 14 comprises a laminated structure disclosed in the FIG. 12. The free layer 18 can include the soft-magnetic underlayer 74 and the storage layer 76 sandwiched by the non-magnetic spacer layer 112. The spacer layer 112 can provide a possibility of exchange coupling control between the layers 74 and 76, and as a result, a possibility to control the spin-polarized current $I_S$ and the switching speed of the MTJ 130.

Figure 14:
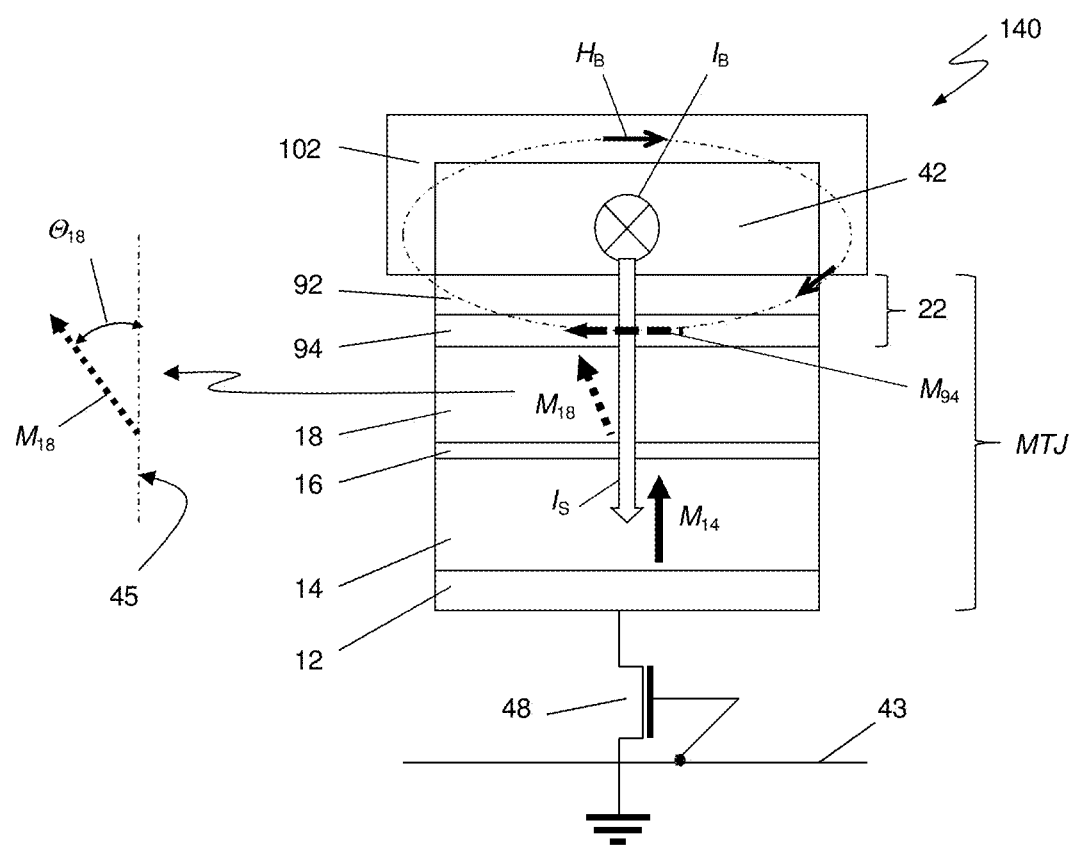
FIGS. 14 and 15 are schematic sectional views of perpendicular MRAM cells with an assist magnetic layer according to still another embodiments of the present application.

FIG. 14 shows a schematic sectional view of MRAM cell 140 according to still another embodiment of the present application. The MRAM cell 140 can include a MTJ element, comprising a pinned layer 14, a free layer 18, a tunnel barrier layer 16 disposed between the pinned 14 and free 16 layers, and contact layers 12 and 22. The contact layer 22 can have a multilayer structure. For example, the contact layer 22 can include a nonmagnetic sublayer 92 and a magnetic sublayer 94 (assist ferromagnetic layer 94), wherein the magnetic sublayer 94 is disposed adjacent to the free layer 18. The sublayer 94 can be made of a soft magnetic material having a substantial magnetic permeability and weak in-plane or perpendicular anisotropy. The opposite side of the contact layer 22 can be electrically coupled to a first conductor line 42. The conductor line 42 may comprise a cladding magnetic layer 102 made of a soft ferromagnetic material having a substantial magnetic permeability ($\mu$>100). The cladding layer 102 can substantially reduce an effect of a bias magnetic field $H_B$ on adjacent memory cells which are not electrically coupled to the first conductor line 42. The bias magnetic field $H_B$ produced by a bias current $I_B$ running through the conductor line 42 can magnetized the magnetic sublayer 94 in a direction shown by an arrow $M_{94}$. The magnetization $M_{94}$ directed along a hard magnetic axis of the free layer 18 can assist in tilting the magnetization direction $M_{18}$ on the angle $\Theta_{18}$ from its equilibrium state. Hence, it can provide a substantial reduction of a spin-polarized switching current $I_S$. The direction of the induced magnetization $M_{94}$ in the magnetic sublayer 94 can be reversed by changing a direction of the bias current $I_B$ in the conductor line 42. A magnitude of the tilt angle $\Theta_{18}$ can be controlled by the bias current $I_B$ permeability, saturation magnetization and thickness of the sublayer 94, by the thickness of sublayer 92, and by other parameters.

Figure 15:
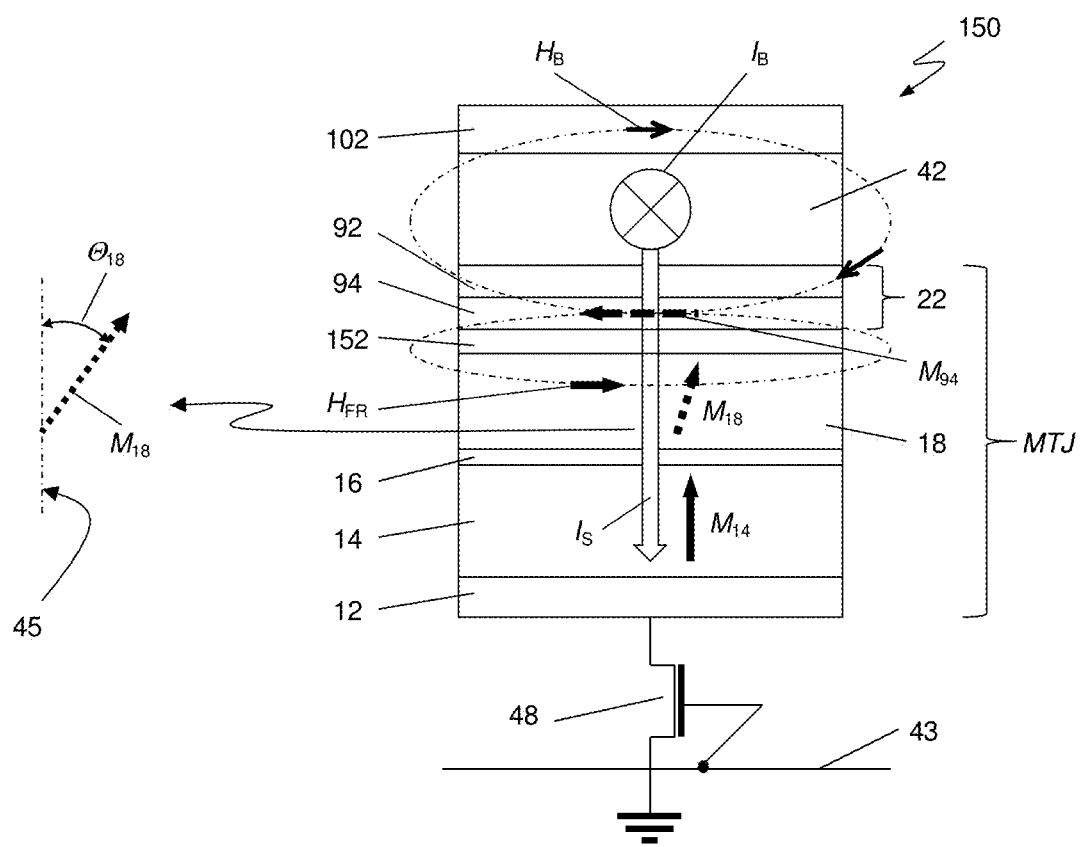

FIG. 15 shows a schematic sectional view of MRAM cell 150 that distinguishes from the cell 140 shown in FIG. 14 by using a nonmagnetic spacer layer 152 and a different design of magnetic cladding 102. The magnetic sublayer 94 can be separated from the free layer 18 by the nonmagnetic spacer layer 152. The bias magnetic field $H_B$ can magnetized the magnetic sublayer 94 in a direction shown by an arrow $M_{94}$. As a result, the magnetized sublayer 94 can produce a fringing magnetic field $H_{FR}$ (shown by arrow) in the vicinity of the free layer 18. The field $H_{FR}$ is applied along a hard magnetic axis of the free layer 18, hence it can assist in tilting the magnetization direction $M_{18}$ on the angle $\Theta_{18}$ from its equilibrium state and provide a substantial reduction of a spin-polarized switching current $I_S$. An effect of the fringing field $H_{FR}$ on the tilt angle $\Theta_{18}$ can be controlled by a thickness of the nonmagnetic spacer layer 152.

Figure 16:
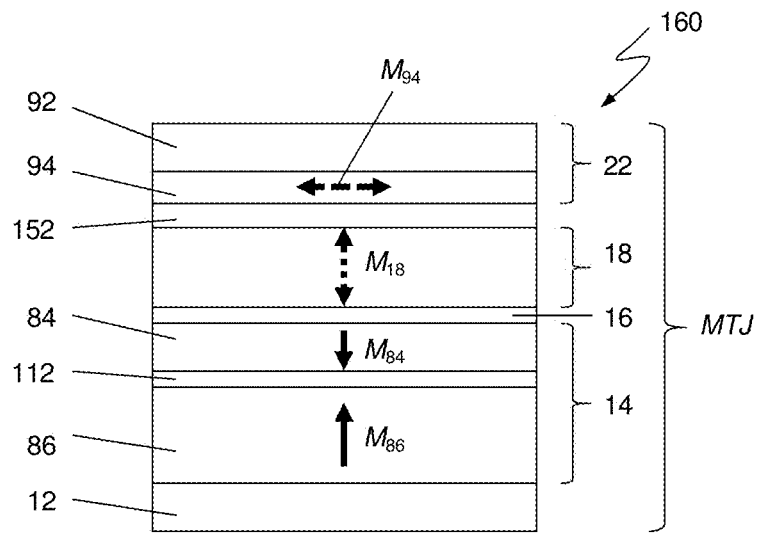
FIG. 16 is a sectional view of a perpendicular MTJ element with an assist magnetic layer and tri-layer structure of the pinned layer according to still another embodiment of present application.

FIG. 16 shows a schematic sectional view of a perpendicular MTJ element 160. The MTJ element 160 includes a multilayer contact layer 22 comprising a magnetic sublayer 94. The sublayer 94 can be magnetized substantially in-plane as shown by the arrows $M_{94}$. The magnetization direction $M_{94}$ can be controlled by a direction of the bias current $I_B$ running through the conductor line 42 (not shown). The pinned layer 14 can have a synthetic anti-ferromagnetic (SAF) structure composed by a spin-polarizing layer 84 and a reference layer 86 separated from each other by a nonmagnetic spacer layer 112. For example, substantial anti-ferromagnetic exchange coupling between the magnetic layers 84 and 86 can be achieved by using the layer 112 made of ruthenium (Ru) and having a thickness of about 0.85 nm. The layers 84 and 86 can have substantially different coercivities, for example the corecivity of the reference layer 86 can be substantially higher than that of the spin-polarizing layer 84. The SAF structure of the pinned layer 14 can provide a substantial reduction of the spin-polarized switching current $I_S$ and a thermal stability increase of the MTJ element 160. The SAF structure of the pinned layer 14 can suppress substantially a fringing magnetic field produced by the layer 14 in the vicinity of the free layer 18.

Figure 17:
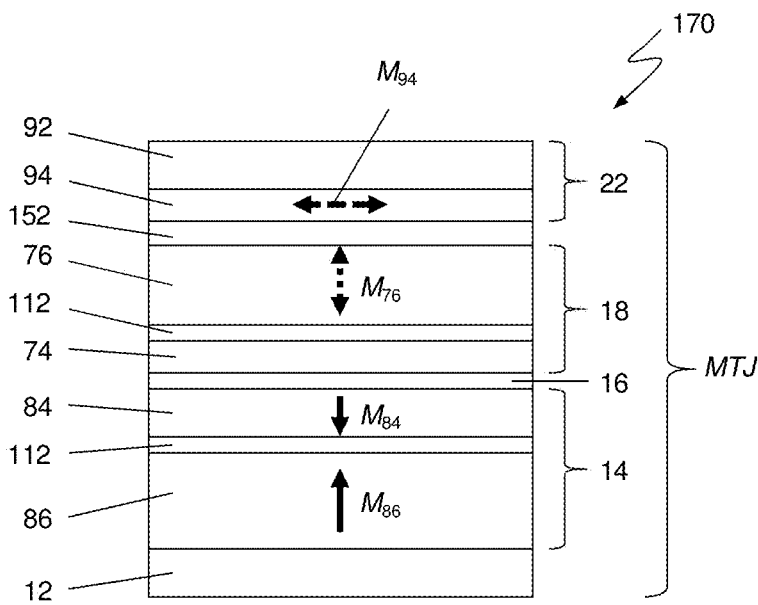
FIG. 17 is a sectional view of a perpendicular MTJ element with an assist magnetic layer and tri-layer structures of the free and pinned layers according to a still another embodiment of the present application.

Yet another embodiment of the present application is shown in FIG. 17. MTJ element 170 distinguishes from the element 160 shown in FIG. 15 by using a tri-layer structure of the free layer 18. The free layer 18 can include a soft magnetic underlayer providing a substantial spin polatization 74 and a storage layer 76 separated from each other by a nonmagnetic spacer layer 112. The layers 74 and 76 can be substantially magnetically coupled to each other through the nonmagnetic spacer layer 112. The layer 112 can provide either ferromagnetic or anti-ferromagnetic exchange coupling between the magnetic layers 74 and 76 depending on its thickness.

There is wide latitude for the choice of materials and their thicknesses within the embodiments of the present application.

The pinned layer 14 can have a thickness of about 3-60 nm and, more specifically, of about 10-30 nm and coercivity measured along its easy axis of about 1000 Oe or more and, more specifically, of about 2000-5000 Oe. The layer 14 can be made of magnetic material having a perpendicular anisotropy such as Co, Fe or Ni-based alloys, for example, CoPt, FePt with L10 structure or similar, their multilayers such as Co/Pt, Co/Pd, CoFe/Pt, Fe/Pt, Fe/Pd, Ni/Co, Co/Ta, Co/W or similar.

The free layer 18 can have a thickness of about 1-15 nm and, more specifically, of about 1-3 nm and coercivity less than 1000 Oe and, more specifically, of about 50-500 Oe. The layer 18 can be made of a soft magnetic material having a perpendicular anisotropy such as Co, Fe or Ni-based alloys, for example, FePt, FePd, CoFe, CoFeB, CoPt, CoFePt and similar, or laminates such as Co/Pt, Co/Pd, Co/Au, CoFe/Ta, CoFe/W, Fe/Pt, Fe/Pd, Ni/Co and similar.

The tunnel barrier layer 16 can have a thickness of about 0.5-5 nm and, more specifically, of about 0.5-1.5 nm. The tunnel barrier layer 16 can be made of MgO, $Al_2O_3$, $Ta_2O_5$, $TiO_2$, MgO—Mg or similar materials, and their based laminates.

The contact layers 12 and 22 can have a thickness of about 1-100 nm and, more specifically, of about 5-25 nm. The layers 12 and 22 can be made of Ta, W, Ti, Cr, Ru, NiFe, CoFeNi, CoFe, CoFeB, NiFeCr, PtMn, IrMn or similar conductive materials or their based laminates.

The conductor lines 42 and 43 can be made of Cu, Al, Au, Ag, AlCu, Ta/Au/Ta, Cr/Cu/Cr or similar materials and their based laminates.

The soft magnetic underlayer 74 can be about 0.5-5 nm thick and can be made of a soft magnetic material with a substantial spin polarization and coercivity of about 1-200 Oe such as Fe, CoFe, CoFeB, NiFe and similar materials or their based laminates such as CoFe/Pt, CoFeB/Pd, CoFe/Ta, CoFeB/W or similar. The material of the soft magnetic underlayer 74 can have either in-plane or perpendicular anisotropy.

The storage layer 76 can have a thickness of about 1-25 nm and, more specifically, of about 2-10 nm and coercivity of about 1000 Oe or less and, more specifically, of about 50-500 Oe. The storage layer 76 can be made of a magnetic material with a substantial perpendicular anisotropy such as Co, Fe or Ni-based alloys and multilayers, for example, CoPt, CoPtCr, FePt, Co/Pt, Co/Pd, Co/Au, CoFe/Pt, CoFeB/Pd, Fe/Pt, Fe/Pd, Ni/Cu or similar.

The spin-polarizing layer 84 can have a thickness of about 0.5-5 nm and can be made of a soft magnetic material with a coercivity of about 1-200 Oe and a substantial spin polarization such as Fe, CoFe, CoFeB, NiFe, CoPt, FeCoPt, FePt with L10 structure and similar or their based laminates such as CoFe/Pd, CoFeB/Pt, CoFe/Ta, CoFeB/W and similar. The material of the spin-polarizing layer 84 can have either in-plane or perpendicular anisotropy.

The reference layer 86 can have a thickness of about 5-100 nm and, more specifically, of about 10-50 nm and coercivity of about 1000 Oe or above and, more specifically, of about 2000-5000 Oe. The reference layer 86 can be made of a magnetic material with a substantial perpendicular anisotropy such as Co, Fe or Ni-based alloys or multilayers, for example, CoPt, FePt, Co/Pt, Co/Pd, Co/Au, CoFe/Pt, CoFeB/Pt, Ni/Co, FePt with L10 structure, CoFeGd, CoFeTb or similar.

The cladding layer 102 can have a thickness of about 10-1000 nm and can be made of a soft magnetic material having a substantial permeability $\mu \geq 100$. The cladding layer 102 can be made of Fe, Co, Ni-based alloys or their based multilayers, such as NiFe, NiFeCo, CoFe, NiFe/$SiO_2$, CoFe/Ru or similar.

The spacer layer 112 can have a thickness of about 0.5-5 nm and, more specifically, of about 0.8-2 nm. The spacer layer 112 can be made of a non-magnetic material such as Ru, Rh, Cu, Pt, Pd, Au, Al, Ta, Cr, W, V or similar and their based alloys, semiconductors, or metal doped insulator such as MgO—Mg, $Al_2O_3$—Al, $SiO_2$—Cu or similar.

The non-magnetic spacer layer 142 can have a thickness of about 1-10 nm and, more specifically, of about 2-5 nm. The spacer layer 142 can be made of a non-magnetic material such as Ru, Ta, Cr, Rh, W, V, Ti or similar, their based alloys or laminates, insulator such as MgO, $Al_2O_3$, MgO—Mg, $SiO_2$—Cu and similar, or semiconductors.

While the specification of this application contains many specifics, these should not be construed as limitations on the scope of the application or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above application is intended to be illustrative, and not restrictive. Many other embodiments will be apparent to those of skill in the art upon reviewing the above description. The scope of the embodiments should be, therefore, determined with reference to the appended claims, along with the full scope of equivalents to which such claims are entitled.

What is claimed is:

1. A magnetic memory cell comprising:
   a magnetoresistive element comprising a free ferromagnetic layer comprising a reversible magnetization direction directed substantially perpendicular to a film plane, a pinned ferromagnetic layer comprising a fixed magnetization direction directed perpendicular to the film plane, a tunnel barrier layer disposed between the free and pinned layers, and an assist ferromagnetic layer disposed adjacent to the free layer at its side distant from the tunnel barrier layer;
   means for providing a bias magnetic field along a magnetic hard axis of the free layer; and
   means for providing a spin-polarized current through the magnetoresistive element in a direction perpendicular to the film plane;
   wherein the pinned layer comprising a synthetic antiferromagnetic structure further comprising:
   a reference layer comprising a first coercivity and the fixed magnetization direction directed perpendicular to the film plane;
   a spin-polarizing layer disposed between the reference layer and the tunnel barrier layer and comprising a second coercivity which is substantially lower than the first coercivity; and
   a second nonmagnetic spacer layer, disposed between the reference layer and the spin-polarizing layer and providing a substantial antiferromagnetic exchange coupling between the reference layer and the spin-polarizing layer.

2. The magnetic memory cell of claim 1, wherein the means for providing the bias magnetic field comprising:
   a conductor line electrically coupled to the magnetoresistive element at a first terminal adjacent to the free layer; and
   a first electrical circuitry coupled to the conductor line.

3. The magnetic memory cell of claim 2, wherein the conductor line further comprising:
   a conductor layer; and
   a ferromagnetic cladding layer disposed at least on a side of the conductor layer distant from the magnetoresistive element.

4. The magnetic memory cell of claim 1, wherein the means for providing the spin-polarized current comprising:
   a selection device electrically coupled to the magnetoresistive element at a second terminal adjacent to the pinned layer, and
   a second electrical circuitry coupled to the selection device.

5. The magnetic memory cell of claim 4, wherein the selection device is a transistor.

6. The magnetic memory cell of claim 1, wherein the magnetoresistive element further comprising a first nonmagnetic spacer layer disposed between the assist and free ferromagnetic layers.

7. The magnetic memory cell of claim 1, wherein the free layer further comprising:
   a storage layer comprising the reversible magnetization direction directed substantially perpendicular to the film plane; and
   a soft magnetic layer disposed between the storage layer and the tunnel barrier layer, and magnetically coupled to the storage layer.

8. The magnetic memory cell of claim 7, wherein the free layer further comprises a third nonmagnetic spacer layer disposed between the storage layer and the soft magnetic layer.

9. The magnetic memory cell of claim 8, wherein the soft magnetic layer is ferromagnetically coupled to the storage layer.

10. The magnetic memory cell of claim 1, wherein the assist layer comprising a ferromagnetic material having a perpendicular magnetic anisotropy.

11. The magnetic memory cell of claim 1, wherein the assist layer comprising a ferromagnetic material having an in-plane magnetic anisotropy.

12. A method of writing to a magnetic memory cell comprising:
   providing a magnetoresistive element comprising a free ferromagnetic layer comprising a reversible magnetization direction directed substantially perpendicular to a film plane, a pinned ferromagnetic layer comprising a fixed magnetization direction directed perpendicular to the film plane, a tunnel barrier layer disposed between the free and pinned ferromagnetic layers, and an assist ferromagnetic layer disposed adjacent to the free layer at its side distant from the tunnel barrier layer;
   driving a bias current pulse through a conductor line in a proximity to but not through the magnetoresistive element and producing a bias magnetic field along a magnetic hard axis of the free layer; and
   driving a spin-polarized current pulse through the magnetoresistive element in a direction perpendicular to the film plane and producing a spin momentum transfer;
   wherein the magnetization direction in the free layer is reversed by a joint effect of the substantially superimposed pulses of the bias and spin-polarized currents,
   wherein the pinned ferromagnetic layer comprising a synthetic antiferromagnetic structure further comprising:
   a reference ferromagnetic layer comprising a first coercivity;
   a spin-polarizing layer disposed adjacent to the tunnel barrier layer and comprising a second coercivity which is substantially lower than the first coercivity; and
   a second nonmagnetic spacer layer disposed between the reference layer and the spin-polarizing layer and providing an antiferromagnetic exchange coupling between the reference and spin-polarizing layers.

13. The method of claim 12, wherein the magnetoresistive element further comprising a first nonmagnetic spacer layer disposed between the free and the assist ferromagnetic layers.

14. A magnetic memory cell comprising:
   a magnetoresistive element comprising a free ferromagnetic layer comprising a reversible magnetization direction directed substantially perpendicular to a film plane, a pinned ferromagnetic layer comprising a synthetic antiferromagnetic structure and having a fixed magnetization direction directed perpendicular to the film plane, a tunnel barrier layer disposed between the free and pinned layers, an assist ferromagnetic layer disposed adjacent to a side of the free layer distant from the tunnel barrier layer, and a first nonmagnetic spacer layer disposed between the free and assist layers;
   a conductor line electrically coupled to the magnetoresistive element at a first terminal adjacent to the free layer; and
   a selection device electrically coupled to the magnetoresistive element at a second terminal adjacent to the pinned layer;
   wherein the magnetization direction in the free layer is reversed by a collective effect of two substantially superimposed pulses of a bias current running through the conductor line and producing a bias magnetic field directed along a magnetic hard axis of the free layer, and a spin-polarized current running through the magnetoresistive element in a direction perpendicular to the film plane and producing a spin momentum transfer,
   wherein the pinned ferromagnetic layer comprising the synthetic antiferromagnetic structure further comprising:
   a reference ferromagnetic layer comprising a first coercivity;
   a spin-polarizing layer disposed adjacent to the tunnel barrier layer and comprising a second coercivity which is substantially lower than the first coercivity; and
   a second nonmagnetic spacer layer disposed between the reference layer and the spin-polarizing layer and providing an antiferromagnetic exchange coupling between the reference and spin-polarizing layers.

15. The magnetic memory cell of claim 14, wherein the assist layer comprising an in-plane magnetic anisotropy.

* * * * *